United States Patent
Tonami et al.

(10) Patent No.: US 7,144,618 B2
(45) Date of Patent: Dec. 5, 2006

(54) MULTILAYER COMPOSITE AND METHOD FOR PREPARING THE SAME

(75) Inventors: Yoshiyuki Tonami, Machida (JP); Yuji Sugiyama, Yokohama (JP); Michiaki Iha, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 65 days.

(21) Appl. No.: 10/681,877

(22) Filed: Oct. 9, 2003

(65) Prior Publication Data

US 2004/0262032 A1 Dec. 30, 2004

(30) Foreign Application Priority Data

Oct. 9, 2002 (JP) ............................. 2002-296479
Jul. 24, 2003 (JP) ............................. 2003-201209

(51) Int. Cl.
*B32B 7/00* (2006.01)

(52) U.S. Cl. ...................... 428/210; 428/209; 428/426; 428/427; 428/694 GR; 428/694 PR; 501/10; 501/32

(58) Field of Classification Search ................ 428/210, 428/209, 426–427, 694 GR, 694 PR; 174/250, 174/258; 501/10, 32
See application file for complete search history.

(56) References Cited

U.S. PATENT DOCUMENTS

| | | | | |
|---|---|---|---|---|
| 4,764,233 A | * | 8/1988 | Ogihara et al. | 156/89.18 |
| 4,788,046 A | * | 11/1988 | Barringer et al. | 264/661 |
| 4,795,670 A | * | 1/1989 | Nishigaki et al. | 428/209 |
| 5,102,720 A | * | 4/1992 | Raj | 428/209 |
| 5,300,163 A | * | 4/1994 | Ohtaki | 156/89.15 |
| 5,601,672 A | * | 2/1997 | Casey et al. | 156/89.16 |
| 5,635,301 A | * | 6/1997 | Kondo et al. | 428/426 |
| 5,708,570 A | * | 1/1998 | Polinski, Sr. | 361/762 |
| 5,866,240 A | * | 2/1999 | Prabhu et al. | 428/210 |
| 5,989,484 A | * | 11/1999 | Ikuina et al. | 264/618 |
| 6,265,090 B1 | * | 7/2001 | Nishide et al. | 428/701 |
| 6,337,123 B1 | * | 1/2002 | Ryugo et al. | 428/210 |
| 6,492,008 B1 | | 12/2002 | Amagi et al. | |
| 6,531,209 B1 | * | 3/2003 | Polis et al. | 428/212 |
| 6,776,861 B1 | * | 8/2004 | Wang et al. | 156/89.11 |
| 6,891,109 B1 | * | 5/2005 | Nishide et al. | 174/258 |

FOREIGN PATENT DOCUMENTS

| | | |
|---|---|---|
| JP | 59-107596 | 6/1984 |
| JP | 02-177391 | 7/1990 |
| JP | 2001-210141 | 8/2001 |
| JP | 2002-026530 | 1/2002 |
| KR | 2001-0060995 | 6/2001 |

OTHER PUBLICATIONS

Official Communication issued on Jun. 17, 2005 in the corresponding Chinese Patent Application No. 2003101007014 (With full English translation).

* cited by examiner

*Primary Examiner*—Cathy F. Lam
(74) *Attorney, Agent, or Firm*—Keating & Bennett, LLP

(57) ABSTRACT

A multilayer composite includes an insulating substrate and patterned conductive layers and insulating layers alternately laminated on the insulating substrate. In a laminating process, a correcting insulating layer is formed on a laminate when a predetermined number of layers are laminated or when a predetermined degree of warpage of the laminate is detected by monitoring. The correcting insulating layer has a different composition from that of the other insulating layers to correct the warpage of the laminate.

15 Claims, 2 Drawing Sheets

MULTILAYER COMPOSITE AND METHOD FOR PREPARING THE SAME

BACKGROUND OF THE INVENTION

1. Field of the Invention

The present invention relates to a multilayer composite including an insulating substrate and patterned conductive layers and insulating layers alternately laminated on the insulating substrate, and a method for preparing the multilayer composite.

2. Description of the Related Art

A conventional electronic component is a multilayer composite including an insulating substrate and patterned conductive layers and insulating layers alternately laminated on the insulating substrate. For example, Japanese Unexamined Patent Application Publication Nos. 2002-26530 and 2001-210141 disclose a method for preparing such a multilayer composite. Referring to FIG. 2A, a patterned conductive layer 21 is made of, for example, a conductive paste on an insulating substrate 20. This patterned conductive layer 21 is fired and then cooled together with the insulating substrate 20. The patterned conductive layer 21 contracts during firing, and the insulating substrate 20 and the patterned conductive layer 21 contract during cooling. The patterned conductive layer 21 has a higher thermal expansion coefficient than the insulating substrate 20. Therefore, the patterned conductive layer 21 contracts more than the insulating substrate 20. The difference in thermal contraction between the insulating substrate 20 and the patterned conductive layer 21 produces a tensile stress in the patterned conductive layer 21. Referring to FIG. 2B, this tensile stress causes the laminate including the insulating substrate 20 and the patterned conductive layer 21 to be warped and concave.

Referring then to FIG. 2C, an insulating layer 22 is laminated on the top of the patterned conductive layer 21. The insulating layer 22 is also fired and cooled. The insulating layer 22 contracts during firing, and the insulating substrate 20 and the insulating layer 22 contract during cooling. As described above, the patterned conductive layer 21 has a higher thermal expansion coefficient than the insulating substrate 20. Such a thermal expansion coefficient produces a tensile stress in the patterned conductive layer 21 and causes the laminate to be warped and concave. In contrast, the insulating layer 22 may have a sufficiently lower thermal expansion coefficient than the insulating substrate 20. Such a thermal expansion coefficient produces a compressive stress in the insulating layer 22. This compressive stress causes the laminate to be warped and convex. Therefore, the compressive stress in the insulating layer 22 cancels the tensile stress in the patterned conductive layer 21. The composition of the insulating layer 22 is determined according to these stresses. Thus, the warpage of the laminate is almost completely corrected.

Referring to FIG. 2D, subsequently, further patterned conductive layers 21 and insulating layers 22 are alternately laminated on the laminate to form a multilayer composite 23. All the insulating layers 22 include the same insulating materials.

As described above, the composition of the insulating layers 22 is determined so as to prevent warpage of the laminate. Nevertheless, the insulating layers 22 cannot completely correct the warpage of the laminate for various reasons, such as variations in the purity of the materials of the insulating layer 22 and problems associated with its preparing equipment. Referring to FIG. 2D, therefore, the laminate, including many patterned conductive layers 21 and insulating layers 22, exhibits a noticeable warpage.

Such a warped laminate presents various problems. For example, a warped bottom surface of the laminate makes it difficult to fix the laminate at a predetermined position for laminating the patterned conductive layers 21. Such a surface also prevents precise formation of the patterned conductive layer 21.

Many multilayer composites 23 can be prepared at the same time using, for example, a mother insulating substrate for forming a plurality of insulating substrates 20. The patterned conductive layers 21 and the insulating layers 22 are alternately laminated on individual areas of the mother substrate at the same time. Each area corresponds to one multilayer composite 23. The individual areas are then separated to form many multilayer composites 23. In this case, a laminate including the mother substrate, the patterned conductive layers 21, and the insulating layers 22 exhibits a noticeable warpage. This warpage, consequently, makes it difficult to fix the laminate or laminate the patterned conductive layers 21 precisely on the laminate. In addition, the laminate cannot be precisely divided into the multilayer composites 23, which, therefore, include many defective products. This results in a decrease in the yield of the multilayer composites 23.

SUMMARY OF THE INVENTION

To overcome the problems described above, preferred embodiments of the present invention provide a flat multilayer composite including an insulating substrate, patterned conductive layers, and insulating layers, and a method for preparing the multilayer composite.

A preferred embodiment of the present invention provides a multilayer composite including an insulating substrate, and patterned conductive layers and insulating layers alternately laminated on the insulating substrate. In this multilayer composite, at least one of the insulating layers defines a correcting insulating layer including vitreous silica and quartz. The ratio of vitreous silica to quartz in the correcting insulating layer is determined such that the thermal expansion coefficient of the correcting insulating layer differs from that of the other insulating layers. Thereby, the correcting insulating layer corrects the warpage of the laminate caused by the difference in thermal expansion coefficient between the other insulating layers, the patterned conductive layers, and the insulating substrate.

Vitreous silica and quartz have significantly different thermal expansion coefficients. Therefore, a change in the ratio of vitreous silica to quartz in the correcting insulating layer produces a significant change in the thermal expansion coefficient of the correcting insulating layer. This provides a correcting insulating layer that corrects the warpage of the laminate more easily and precisely and, therefore, that produces a flat multilayer composite.

In addition, vitreous silica and quartz have nearly equivalent relative dielectric constants. Therefore, a change in the ratio of vitreous silica to quartz in the correcting insulating layer causes very little change in the relative dielectric constant of the correcting insulating layer. Thus, the correcting insulating layer, having a different composition from that of the other insulating layers, causes very little change in the total relative dielectric constant of the multilayer composite while correcting the warpage of the laminate. This prevents changes in the electrical characteristics associated with the relative dielectric constant of the multilayer composite.

In the multilayer composite, at least the top layer of the laminate is preferably the correcting insulating layer. This facilitates preparation of a multilayer composite having flat top and bottom surfaces.

In the multilayer composite, the patterned conductive layers are preferably formed by patterning a photosensitive conductive paste by photolithography.

In addition, at least one of the insulating layers preferably includes a via hole, at least two of the patterned conductive layers are connected by the via hole, and the insulating layer is formed by patterning a photosensitive insulating paste by photolithography.

Photolithography, which is unsuitable for a warped laminate, can be used to laminate the patterned conductive layers having the via hole precisely on a flat laminate prepared according to preferred embodiments of the present invention. Therefore, the present invention provides a multilayer composite having high performance and reliability.

Preferred embodiments of the present invention further provide a multilayer composite including an insulating substrate, and patterned conductive layers and insulating layers alternately laminated on the insulating substrate. In this multilayer composite, each insulating layer includes vitreous silica and quartz, and at least one of the insulating layers defines a correcting insulating layer. The ratio of vitreous silica to quartz in the correcting insulating layer differs from that in the other insulating layers such that the thermal expansion coefficient of the correcting insulating layer differs from that of the other insulating layers. Thereby, the correcting insulating layer corrects the warpage of the laminate caused by the difference in thermal expansion coefficient between the other insulating layers, the patterned conductive layers, and the insulating substrate.

As described above, vitreous silica and quartz have substantially equivalent relative dielectric constants. This provides a uniform relative dielectric constant over the multilayer composite, irrespective of the correcting insulating layer.

Another preferred embodiment of the present invention provides a method for preparing a multilayer composite. This method includes the steps of alternately laminating patterned conductive layers and insulating layers on an insulating substrate to form a laminate, changing a composition of the insulating layer to a different composition from that of the other insulating layers to form a correcting insulating layer to correct the warpage of the laminate when a predetermined number of layers are laminated or when a predetermined degree of warpage of the laminate is detected by monitoring the laminating, and laminating the correcting insulating layer on the laminate.

According to this method, the warpage of the laminate is effectively corrected by laminating the correcting insulating layer. This prevents various problems attributed to the warpage of the laminate and, for example, enhances the yield of the multilayer composites.

Other features, elements, characteristics, steps and advantages of the present invention will become more apparent from the following detailed description of preferred embodiments thereof with reference to the attached drawings.

DETAILED DESCRIPTION OF PREFERRED EMBODIMENTS

Preferred embodiments according to the present invention will now be described with reference to the drawings.

Figure 1A:
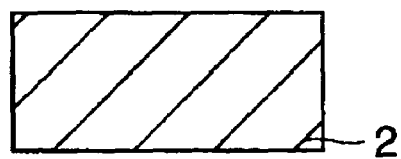
FIGS. 1A, 1B, 1C, 1D, 1E, 1F, and 1G illustrate a multilayer composite and a method for preparing the multilayer composite according to preferred embodiments of the present invention.
Figure 1B:
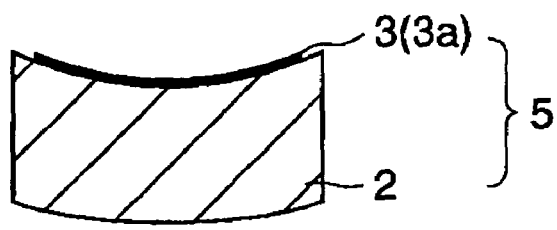
Figure 1C:
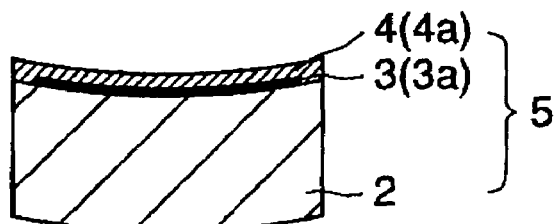
Figure 1D:
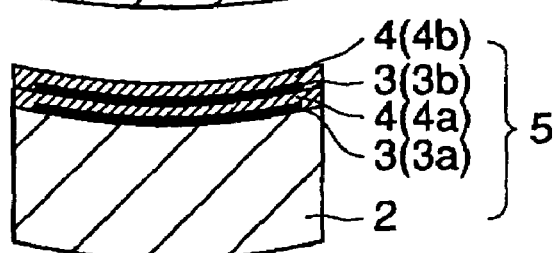
Figure 1E:
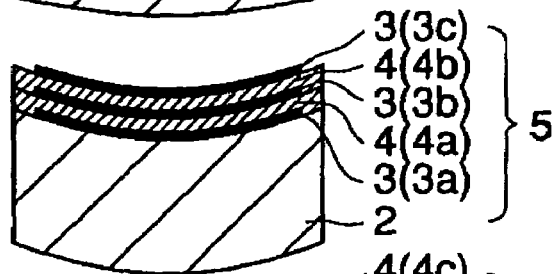
Figure 1F:
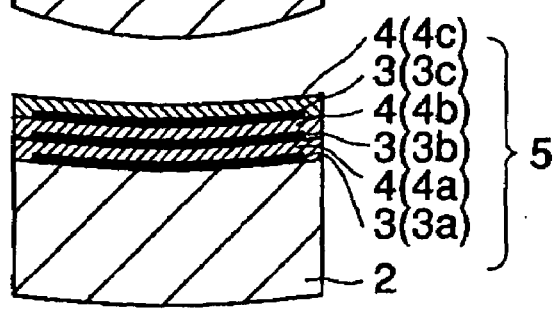
Figure 1G:
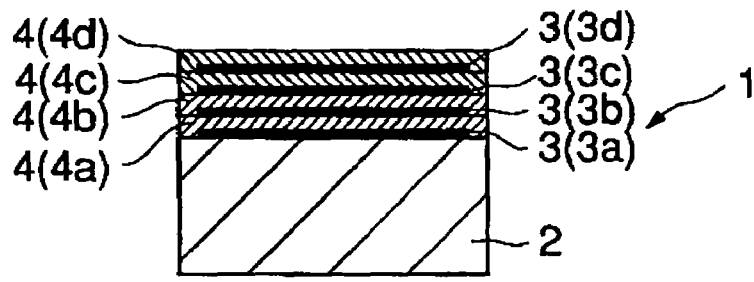
Figure 2A:
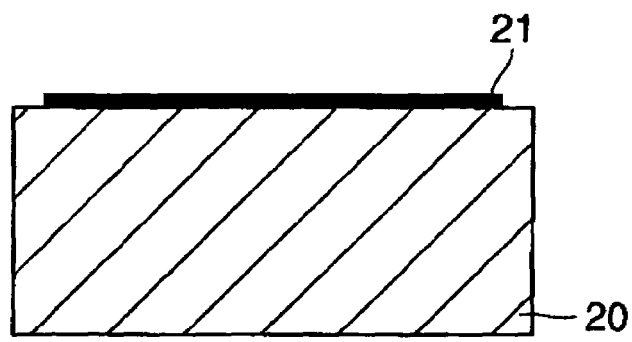
FIGS. 2A, 2B, 2C, and 2D illustrate an example of the steps of preparing a known multilayer composite.
Figure 2B:
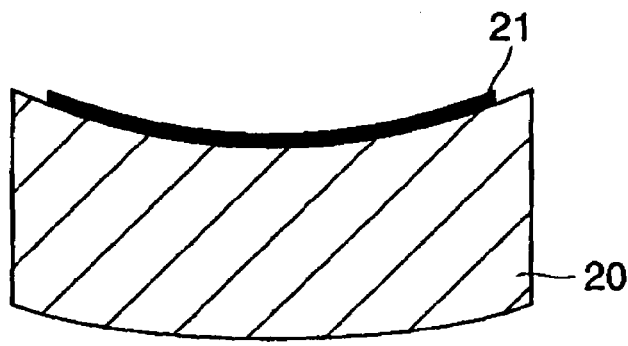
Figure 2C:
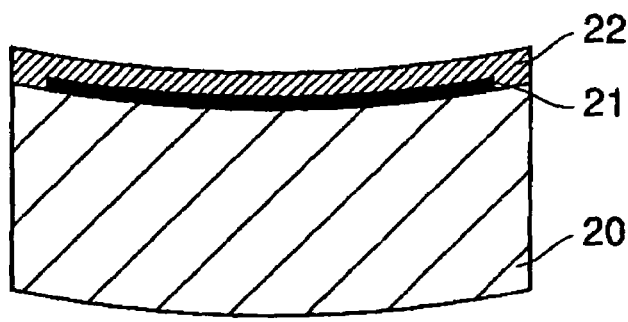
Figure 2D:
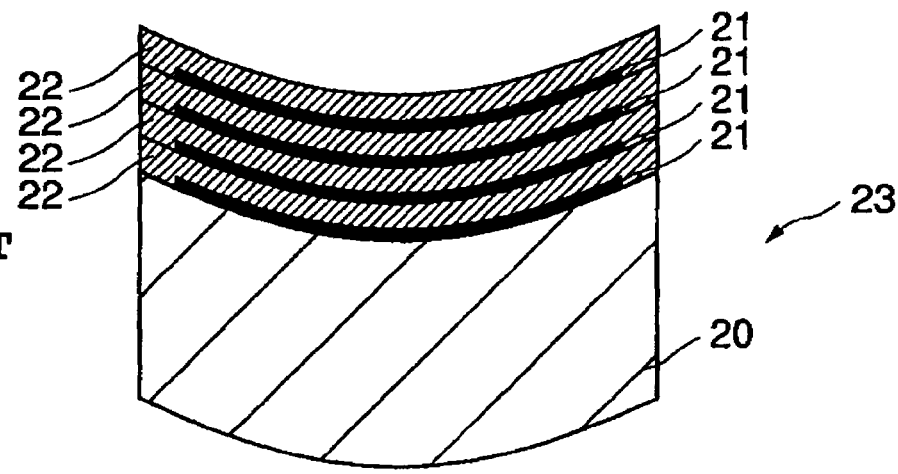

In a preferred embodiment, a multilayer composite 1, as shown in FIG. 1G, includes an insulating substrate 2, and patterned conductive layers 3 and insulating layers 4 alternately laminated on the top of the insulating substrate 2. The multilayer composite 1 includes at least one of the insulating layers 4 (4a, 4b, 4c, and 4d) which has a composition for providing a different thermal expansion coefficient from that of the other insulating layers 4.

The multilayer composite 1 will now be described together with an example of its preparation process. Referring to FIG. 1A, the insulating substrate 2 is made of, for example, an alumina substrate or a glass substrate. A patterned conductive layer 3 (3a) is laminated on the top surface of the insulating substrate 2. The pattern of this patterned conductive layer 3 (3a) is not limited in the present invention, and various patterns are permitted according to the design of the multilayer composite 1. Examples of the pattern of the patterned conductive layer 3 (3a) include a coil pattern, an electrode pattern for a capacitor, and a line pattern for a microstrip line or a coplanar line.

Also, a method for laminating the patterned conductive layers 3 is not limited to this preferred embodiment, and various methods such as photolithography and screen printing can be used. For photolithography, a photosensitive conductive paste, such as a photosensitive Ag paste, is applied entirely over the top surface of the insulating substrate 2. This photosensitive conductive paste is irradiated with light through a mask to form a conductive pattern. The irradiated portion, which corresponds to the patterned conductive layers 3, of the photosensitive conductive paste is then cured. The uncured portion is developed and removed to form a patterned conductive layer 3.

The patterned conductive layer 3 (3a) is fired, and a laminate 5 including the insulating substrate 2 and the patterned conductive layer 3 (3a) is then cooled. During this step, the difference in thermal contraction, which results from the difference in the thermal expansion coefficient, between the insulating substrate 2 and the patterned conductive layer 3 (3a) produces a tensile stress in the patterned conductive layer 3 (3a). Referring to FIG. 1B, this tensile stress causes the laminate 5 to be warped and concave.

Referring then to FIG. 1C, an insulating layer 4 (4a) is laminated on the top of the patterned conductive layer 3 (3a). The insulating layer 4 (4a) includes, for example, borosilicate glass and any of a vitreous silica (silica glass), quartz, a mixture of vitreous silica and quartz, and a mixture of vitreous silica, quartz, and another material such as potassium oxide ($K_2O$) and boron oxide ($B_2O_3$). Vitreous silica here indicates vitreous silica having a low thermal expansion coefficient or high silica glass. An example of high silica glass is 96% silica glass (Vycor® made by Corning). At least one of the insulating layers 4 includes borosilicate glass and a mixture of vitreous silica and quartz. The insulating layer 4 (4a) will now be described in detail.

The insulating layer 4 (4a) has a composition for correcting the warpage of the laminate 5 attributed to the firing of the insulating substrate 2 and the patterned conductive layer 3 (3a). In other words, the insulating layer 4 (4a) has a composition for producing a compressive stress that cancels the tensile stress in the patterned conductive layer 3 (3a).

If the insulating layer 4 (4a) includes vitreous silica and quartz, the ratio of vitreous silica to quartz in the insulating layer 4 (4a) is determined so as to correct the warpage of the laminate 5.

The insulating layer 4 (4a) may include, for example, a via hole for connecting the patterned conductive layer 3a and a patterned conductive layer 3b. In this case, a hole part for forming the via hole must be provided in the insulating layer 4a in the step of forming the insulating layer 4a. The hole part can be formed by various methods, and any suitable method is permitted in the present invention. For example, the hole part for the via hole may be formed by laser processing after forming the insulating layer 4a or the hole part may be formed by photolithography. For photolithography, a photosensitive insulating paste which defines the insulating layer 4a is applied over the patterned conductive layer 3a. This photosensitive insulating paste is irradiated with light through a mask to form the hole part for the via hole. A region of the photosensitive insulating paste other than a region where the hole part for the via hole is formed is cured. After that, the uncured part of the photosensitive insulating paste is developed and removed to form the hole part, and the insulating layer 4a having the hole part for the via hole is provided.

After forming the insulating layer 4a, a conductive pattern 3b is formed over the insulating layer 4a. When forming the conductive pattern 3b, warpage in the laminate 5 including the insulating substrate 2, the conductive pattern 3 (3a), and the insulating layer 4 (4a) is corrected by the insulating layer 4a. The insulating layer 4 (4a) corrects the warpage of the laminate 5, that is, the top and bottom surfaces of the laminate 5 are substantially flat before the patterned conductive layer 3b is laminated on the top of the insulating layer 4a. This avoids problems attributed to the warpage of the laminate 5 in the step of laminating the patterned conductive layer 3b, for example, the problem that the bottom surface of the insulating substrate 2 cannot be used to fix the laminate 5 because of the warpage of the laminate 5, and the problem that photolithography cannot be used to precisely form the patterned conductive layer 3b.

The patterned conductive layer 3b may have various patterns. For example, the patterned conductive layer 3b may have the same pattern as the patterned conductive layer 3a or a different pattern from the patterned conductive layer 3a.

After forming the conductive pattern 3b, a portion of the conductive layer 3b is filled in the hole part of the insulating layer 4a, and then the via hole for connecting the patterned conductive layers 3a and 3b is formed.

Referring to FIG. D, an insulating layer 4b is then laminated on the top of the patterned conductive layer 3b in the same manner as the insulating layer 4a. Subsequently, further patterned conductive layers 3 and insulating layers 4 are alternately laminated on the laminate 5.

As described above, the insulating layers 4a and 4b have a composition for correcting the warpage of the laminate 5 caused by the difference in thermal expansion coefficient between the insulating substrate 2, the patterned conductive layers 3, and the insulating layers 4. However, the insulating layers 4a and 4b may not satisfactorily correct the warpage of the laminate 5 because of various causes. Referring to FIG. 1E, consequently, as more patterned conductive layers 3 and insulating layers 4 are laminated on the laminate 5, the laminate 5 is more noticeably warped. Further insulating layers 4 (hereinafter referred to as insulating layers 4c and 4d in this preferred embodiment for convenience of description), having the same composition as the insulating layers 4 (4a and 4b), cannot effectively correct the warpage of the concave or convex laminate 5.

In this preferred embodiment, when the laminate 5 is noticeably warped, the composition of the insulating layers 4 (4c and 4d) is changed to another composition for correcting the warpage of the laminate 5. The composition of the insulating layers 4 is preferably changed when a predetermined number of layers are laminated, or when a predetermined degree of warpage is detected by monitoring the laminate 5 in the process of laminating the patterned conductive layers 3 and the insulating layers 4.

The composition of the insulating layers 4 (4c and 4d in this preferred embodiment) is not limited to this preferred embodiment; it is determined depending on whether the laminate 5 is concave or convex and how much the laminate 5 is warped. For example, if the laminate 5 on which the insulating layer 4b is laminated is concave, as shown in FIG. 1D, the tensile stress in the patterned conductive layers 3a and 3b is greater than the compressive stress in the insulating layers 4a and 4b. Therefore, the insulating layers 4c and 4d, having a compressive stress that is greater than the insulating layers 4a and 4b, provides a total compressive stress in the insulating layers 4 that is substantially equivalent to the total tensile stress in the patterned conductive layers 3. As a result, the compressive stress in the insulating layers 4 cancels the tensile stress in the patterned conductive layers 3 to correct the warpage of the laminate 5. For this purpose, the insulating layers 4c and 4d have a composition with a lower thermal expansion coefficient than the insulating layers 4a and 4b.

For example, vitreous silica has a thermal expansion coefficient of about $0.5 \times 10^{-5}/°$ C., while quartz has a thermal expansion coefficient of about $8.0 \times 10^{-5}/°$ C. to $13.4 \times 10^{-5}/°$ C., each depending upon its crystal axis. Therefore, if the laminate 5 including the insulating layers 4a and 4b including quartz is concave, the insulating layers 4c and 4d may contain, for example, vitreous silica, which has a lower thermal expansion coefficient than the insulating layers 4a and 4b, or both vitreous silica and quartz depending upon the degree of warpage. For the insulating layers 4c and 4d including vitreous silica and quartz, the ratio of vitreous silica to quartz, which have different thermal expansion coefficients, can be adjusted to provide a different thermal expansion coefficient. Therefore, the ratio of vitreous silica to quartz in the insulating layers 4c and 4d is determined so as to correct the warpage of the laminate 5. This allows highly precise correction of the warpage of the laminate 5. If the insulating substrate 2 is made of alumina, which has a thermal expansion coefficient of about $8 \times 10^{-6}/°$ C., and the insulating layers 4 do not contain vitreous silica, the insulating layers 4 contract so as to be warped and concave during the firing, and the insulating substrate 2 is also warped so as to be concave attributed to the difference in the degree of thermal contraction during the cooling. This results in a tensile stress in the insulating layers 4, as well as that in the patterned conductive layers 3.

Another example of the composition of the insulating layers 4c and 4d for correcting the warpage of the concave laminate 5 will now be described. If all the insulating layers 4 (4a, 4b, 4c, and 4d) include vitreous silica and quartz, the ratio of vitreous silica to quartz in the insulating layers 4c and 4d may be greater than that in the insulating layers 4a and 4b. The insulating layers 4c and 4d, therefore, have a lower thermal expansion coefficient than the insulating layers 4a and 4b so as to correct the warpage of the concave laminate 5.

If the laminate 5 is convex, the compressive stress in the insulating layers 4a and 4b is greater than the tensile stress in the patterned conductive layers 3a and 3b. That is, in the convex laminate 5, the relationship between the compressive stress in the insulating layers 4a and 4b and the tensile stress in the patterned conductive layers 3a and 3b is opposite to that in the concave laminate 5. To correct the warpage of the convex laminate 5, the insulating layers 4c and 4d have a composition that provides a higher thermal expansion coefficient than the insulating layers 4a and 4b. This results in a smaller compressive stress in the insulating layers 4c and 4d than that in the insulating layers 4a and 4b, or a tensile stress in the insulating layers 4c and 4d.

For example, if the laminate 5 including the insulating layers 4a and 4b containing vitreous silica is convex, the insulating layers 4c and 4d may include quartz or both vitreous silica and quartz according to the degree of warpage of the laminate 5.

Another example will now be described. If all the insulating layers 4 (4a, 4b, 4c, and 4d) include vitreous silica and quartz, the ratio of vitreous silica to quartz in the insulating layers 4c and 4d is less than that in the insulating layers 4a and 4b. The insulating layers 4c and 4d, therefore, have a higher thermal expansion coefficient than the insulating layers 4a and 4b so as to correct the warpage of the convex laminate 5.

Referring to FIGS. 1F and 1G, the insulating layers 4c and 4d having a composition determined according to the degree of warpage are sequentially laminated on the laminate 5 to correct the warpage of the laminate 5. That is, the insulating layer 4d, which is the top layer of the laminate 5 and the insulating layer 4c, which is directly under the insulating layer 4d, define correcting insulating layers among the insulating layers 4 in this preferred embodiment.

The multilayer composite 1 can be prepared as described above.

The present invention is not limited to the above-described preferred embodiment. For example, four patterned conductive layers 3 and four insulating layers 4 are laminated on the laminate 5 in this preferred embodiment. However, the numbers of the patterned conductive layers 3 and the insulating layers 4 are not limited to this preferred embodiment.

According to this preferred embodiment, in the process of preparing the multilayer composite 1, the composition of the insulating layers 4 is adjusted when the insulating layer 4c is laminated on the laminate 5. However, the degree of warpage of the laminate 5 depends on various factors, such as the composition and shape of the patterned conductive layers 3, the composition of the insulating substrate 2, and the composition of the lower insulating layers 4. Therefore, changing the composition of the insulating layers 4 is not limited to the step of laminating the insulating layer 4c, and the composition of the insulating layers 4 may be changed when an appropriate number of layers are laminated according to, for example, the degree of warpage of the laminate 5.

A plurality of laminates 5, even if prepared in the same manner, may have variations in the degree of warpage because of, for example, variations in the compositions of the insulating substrate 2, the patterned conductive layers 3, and the insulating layers 4, or changes in the conditions of equipment or materials for preparing the multilayer composite 1 with, for example, the passage of time. Then, the composition of the insulating layers 4 may be changed when a different number of layers are laminated, or the correcting insulating layers 4 (4c and 4d) may have a different composition.

In such cases, for example, the individual insulating layers 4 preferably include vitreous silica, quartz, or both vitreous silica and quartz in consideration of the relative dielectric constant. Vitreous silica, which has a relative dielectric constant of about 4.0, and quartz, which has a relative dielectric constant of about 4.3, have very little difference in the relative dielectric constant. Such a degree of difference does not significantly change the total relative dielectric constant of the multilayer composite 1. The relative dielectric constant is associated with the electrical characteristics of the multilayer composite 1. Therefore, suppression of a change in the relative dielectric constant prevents changes in the electrical characteristics of the multilayer composite 1 caused by a change in the composition of the insulating layers 4.

As described above, the laminates 5 may have variations in the degree of warpage. Then, for example, at least one of the insulating layers 4 may include vitreous silica and quartz to function as a correct insulating layer. The ratio of vitreous silica to quartz in the correcting insulating layer is determined according to the degree of the warpage of the laminate 5 to meet different degrees of warpage. This correcting insulating layer also causes substantially no change in the relative dielectric constant. Therefore, a change in the ratio of vitreous silica to quartz in the correcting insulating layer does not deteriorate the electrical characteristics of the multilayer composite 1.

The composition of the insulating layers 4 is changed once in this preferred embodiment. For a large number of patterned conductive layers 3 and insulating layers 4, for example, the composition of the insulating layers 4 may be changed two or more times. Then, for example, the insulating layers 4 may include one including vitreous silica, one including quartz, and one including both vitreous silica and quartz.

In this preferred embodiment, the insulating layers 4 include vitreous silica, quartz, or both vitreous silica and quartz. The insulating layers 4 may include another insulating material, where at least one of the insulating layers 4 includes vitreous silica and quartz to function as a correcting insulating layer.

In this preferred embodiment, the multilayer composite 1 is preferably prepared one by one. The multilayer composite 1 may be prepared using, for example, a mother substrate for forming a plurality of insulating substrates 2. The patterned conductive layers 3 and the insulating layers 4 are alternately laminated on individual areas of the mother substrate at one time. The areas are then separated to form a plurality of multilayer composites 1.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:
1. A multilayer composite comprising:
an insulating substrate; and
patterned conductive layers and insulating layers alternately laminated on the insulating substrate to define a laminate; wherein at least one of the insulating layers defines a correcting insulating layer including vitreous silica and quartz;

the ratio of vitreous silica to quartz in the correcting insulating layer such that the thermal expansion coefficient of the correcting insulating layer differs from that of the insulating layers that do not define the correcting insulating layer, such that the correcting insulating layer corrects the warpage of the laminate attributed to a difference in thermal expansion coefficients between the insulating layers that do not define the correcting insulating layer, the patterned conductive layers, and the insulating substrate; and each of the insulating layers including the correcting insulating layer are composed of the same materials, and the only difference between the correcting insulating layer and the remaining insulating layers is the ratio of vitreous silica to quartz.

2. The multilayer composite according to claim 1, wherein at least a top layer of the laminate is the correcting insulating layer.

3. The multilayer composite according to claim 1, wherein the patterned conductive layers include a patterned photosensitive conductive paste.

4. The multilayer composite according to claim 1, wherein at least one of the insulating layers has a via hole, at least two of the patterned conductive layers are connected through said via hole, and said at least one of the insulating layers is made of a patterned photosensitive insulating paste.

5. The multilayer composite according to claim 1, wherein each of the insulating layers includes vitreous silica and quartz.

6. The multilayer composite according to claim 1, wherein at least one of the insulating layers includes a via hole for connecting two of said patterned conductive layers.

7. The multilayer composite according to claim 1, wherein the at least one of the insulating layers defining the correcting insulating layer includes more vitreous silica than quartz to correct a concave warpage of the laminate.

8. The multilayer composite according to claim 1, wherein the at least one of the insulating layers defining the correcting insulating layer includes more quartz than vitreous silica to correct a convex warpage of the laminate.

9. A multilayer composite comprising:

an insulating substrate; and patterned conductive layers and insulating layers alternately laminated on the insulating substrate so as to define a laminate; wherein each of the insulating layers includes vitreous silica and quartz;

at least one of the insulating layers defines a correcting insulating layer;

the ratio of vitreous silica to quartz in the correcting insulating layer differs from that in the other insulating layers such that the thermal expansion coefficient of the correcting insulating layer differs from that of the insulating layers that do not define the correcting insulating layer, such that the correcting insulating layer corrects the warpage of the laminate attributed to a difference in thermal expansion coefficient between the insulating layers that do not define the correcting insulating layer, the patterned conductive layers, and the insulating substrate; and each of the insulating layers including the correcting insulating layer are composed of the same materials, and the only difference between the correcting insulating layer and the remaining insulating layers is the ratio of vitreous silica to quartz.

10. The multilayer composite according to claim 9, wherein at least a top layer of the laminate is the correcting insulating layer.

11. The multilayer composite according to claim 9, wherein the patterned conductive layers are made of a patterned photosensitive conductive paste.

12. The multilayer composite according to claim 9, wherein at least one of the insulating layers has a via hole, at least two of the patterned conductive layers are connected through said via hole, and said insulating layer is made of a patterned photosensitive insulating paste.

13. The multilayer composite according to claim 9, wherein at least one of the insulating layers includes a via hole for connecting two of said patterned conductive layers.

14. The multilayer composite according to claim 9, wherein the at least one of the insulating layers defining the correcting insulating layer includes more vitreous silica than quartz to correct a concave warpage of the laminate.

15. The multilayer composite according to claim 9, wherein the at least one of the insulating layers defining the correcting insulating layer includes more quartz than vitreous silica to correct a convex warpage of the laminate.

* * * * *